US010975668B2

(12) United States Patent
Liu et al.

(10) Patent No.: US 10,975,668 B2
(45) Date of Patent: Apr. 13, 2021

(54) RAPID STEAM ALLOCATION MANAGEMENT AND OPTIMIZATION FOR OIL SANDS

(71) Applicant: GE Inspection Technologies, LP, Lewistown, PA (US)

(72) Inventors: Guoxiang Liu, Oklahoma City, OK (US); Mahendra Joshi, Katy, TX (US); Robert Klenner, Oklahoma City, OK (US); Glen Murrell, Oklahoma City, OK (US); Steven Azzaro, Oklahoma City, OK (US)

(73) Assignee: GE INSPECTION TECHNOLOGIES, LP, Lewistown, PA (US)

( * ) Notice: Subject to any disclaimer, the term of this patent is extended or adjusted under 35 U.S.C. 154(b) by 391 days.

(21) Appl. No.: 15/940,072

(22) Filed: Mar. 29, 2018

(65) Prior Publication Data
US 2019/0301269 A1 Oct. 3, 2019

(51) Int. Cl.
*E21B 41/00* (2006.01)
*E21B 43/24* (2006.01)
(Continued)

(52) U.S. Cl.
CPC ...... *E21B 41/0092* (2013.01); *E21B 43/2406* (2013.01); *E21B 47/10* (2013.01);
(Continued)

(58) Field of Classification Search
CPC .. E21B 41/0092; E21B 43/2406; E21B 47/10; E21B 47/07; E21B 43/34; G06F 30/20; G06Q 10/0631
See application file for complete search history.

(56) References Cited

U.S. PATENT DOCUMENTS 4,159,743 A * 7/1979 Rose ...................... E21B 36/02
166/302
7,809,538 B2   10/2010 Thomas
(Continued)

FOREIGN PATENT DOCUMENTS

WO   WO-2017087990   5/2017
WO   WO-2018044291   3/2018

OTHER PUBLICATIONS

Cao, Fei, Haishan Luo, and Larry W. Lake. "Oil-rate forecast by inferring fractional-flow models from field data with Koval method combined with the capacitance/resistance model." SPE Reservoir Evaluation & Engineering 18, No. 04 (2015): 534-553. (Year: 2015).*

(Continued)

*Primary Examiner* — Chuen-Meei Gan
(74) *Attorney, Agent, or Firm* — Mintz Levin Cohn Ferris Glovsky and Popeo, PC; Lisa Adams

(57) ABSTRACT

The current subject matter is related to optimizing resource (e.g., steam) allocation within steam assisted gravity drainage (SAGD) system, and predicting future oil production from production wells of the SAGD system. In some embodiments data characterizing a hypothetical rate of steam injection into injection wells of the SAGD system can be applied within a capacitance resistance model (CRM) to determine an estimated rate of future fluid production, the fluid being a mixture of oil and water. An emulsion viscosity, as well as the estimate rate of future fluid production, can be applied within a Koval fractional flow model to determine an estimate rate of future oil production. In some cases, the hypothetical rate of steam injection can be optimized based on an optimization objective, e.g., a steam-to-oil ratio (SOR).

25 Claims, 6 Drawing Sheets

(51) Int. Cl.
  *E21B 47/10* (2012.01)
  *G06Q 10/06* (2012.01)
  *G06F 30/20* (2020.01)
  *E21B 43/34* (2006.01)
  *E21B 47/07* (2012.01)

(52) U.S. Cl.
  CPC ......... *G06F 30/20* (2020.01); *G06Q 10/0631* (2013.01); *E21B 43/34* (2013.01); *E21B 47/07* (2020.05)

(56) References Cited

U.S. PATENT DOCUMENTS

| | | | |
|---|---|---|---|
| 8,204,693 B2 | 6/2012 | Briers et al. | |
| 8,756,019 B2 | 6/2014 | Pimenov et al. | |
| 8,775,141 B2 | 7/2014 | Raphael | |
| 9,031,823 B2 | 5/2015 | Ranjan et al. | |
| 2003/0042018 A1 | 3/2003 | Huh et al. | |
| 2008/0283245 A1* | 11/2008 | Tuk | E21B 43/24 166/302 |
| 2011/0180459 A1* | 7/2011 | Duyvesteyn | C10G 1/042 208/391 |
| 2011/0288778 A1* | 11/2011 | Pavlovich | E21B 43/2406 702/12 |
| 2011/0295771 A1* | 12/2011 | Dawson | G06Q 99/00 705/500 |
| 2012/0053920 A1* | 3/2012 | Rai | G01V 9/00 703/10 |
| 2012/0330553 A1* | 12/2012 | Mollaei | E21B 43/16 702/11 |
| 2013/0146285 A1* | 6/2013 | Chhina | E21B 43/30 166/268 |
| 2014/0303951 A1* | 10/2014 | Houeto | E21B 43/00 703/10 |
| 2016/0178799 A1 | 6/2016 | Sayarpour et al. | |
| 2017/0177992 A1 | 6/2017 | Klie | |
| 2017/0226836 A1 | 8/2017 | Sanders et al. | |
| 2017/0350217 A1 | 12/2017 | Paul et al. | |
| 2018/0087358 A1* | 3/2018 | Conn | E21B 43/2406 |

OTHER PUBLICATIONS

Cao, F. et al. Oil-rate forecast by inferring fractional-flow models from field data with Koval method combined with the capacitance/resistance model. SPE Reservoir Evaluation and Engineering (2015) 18(4), 534-563.

Hong, A.J. et al. Robust production optimization with capacitance-resistance model as precurser . Comput Geosci (2017) 21: 1423.

Shafiei, A. Mathematical and Statistical Investigation of Steamflooding in Naturally Fractured Carbonate Heavy Oil Reservoirs, Ph.D. Thesis, University of Waterloo, Canada (2013).

Stone, T. et al. Optimization of subcool in SAGD Bitumen Process. World Heavy Oil Congress, New Orleans, LA (2014).

Weber, D.E. The Use of Capacitance-Resistance Models to Optimize Injection Allocation and Well Location in Water Floods. Dissertation, University of Texas at Austin, (2009).

Wei et al., "Prediction for steam chamber development and production performance in SAGD process," Journal of Natural Gas Science and Engineering, vol. 19, Jun. 2014, pp. 303-310.

International Search Report and Written Opinion for corresponding International Patent Application No. PCT/US2019/024326, dated Jul. 10, 2019, 8 pages.

* cited by examiner

RAPID STEAM ALLOCATION MANAGEMENT AND OPTIMIZATION FOR OIL SANDS

BACKGROUND

Steam assisted gravity drainage (SAGD) is an enhanced oil recovery technique that can be used in the production of heavy crude oil or bitumen from oil sands. The technique may involve drilling a pair of horizontal wells into an oil sand reservoir. The well pair can include an injection well, and a production well below the injection well. Steam can be injected into the injection well, and the steam can permeate a portion of the reservoir to form a steam chamber. Heat from the steam can reduce the viscosity of the heavy crude oil and/or bitumen, which allows it to flow into the production well. The production well can collect a mixture of the heated heavy crude oil and/or bitumen, as well as formation water and water condensed from the steam. The mixture can be pumped to the surface, where the heavy crude oil and/or bitumen are separated from the mixture.

SUMMARY

The cost of heating the water in the steam generator to produce the steam for SAGD production may be a large factor in the operating cost of SAGD operations. Efficient allocation of the steam to the multiple wells in one or more well pads can facilitate improved production economics compared to less efficient allocation of the steam to the wells. However, it is difficult to fully characterize and understand the subterranean reservoir in order to determine how to efficiently allocate the steam among the wells.

In some cases, limited observations can be used to provide some insight for controlling the allocation of the limited steam resources. However, such methods generally fail to substantially increase efficiency of steam utilization and/or increase oil production relative to random allocation of steam to the wells. Computer generated models of the wells and/or the well pad can be used in an attempt to optimize steam resource allocation, however, the models are complex and involve a relatively high number of variables. As a result of the complexity of the models, the modeling is very time intensive, often requiring at least six months to multiple years to generate a result. Furthermore, hydrocarbon saturation within the subterranean reservoir may change in the intervening time period while the computers are running the model. Therefore, that the result that the model generates may be outdated, and may not reflect current conditions of the reservoir.

Systems, devices, articles, and methods for rapid steam allocation management and optimization are provided. In one embodiment, a method is provided that includes receiving operational data characterizing operating parameters of a steam assisted gravity drainage (SAGD) system. The SAGD system can include at least one injection well configured to deliver steam to an oil sands reservoir, and at least one production well configured receive a fluid, which can be a mixture of oil and water from the oil sands reservoir. The operating parameters can include data characterizing a viscosity of an emulsion of bitumen and water, referred to as an emulsion viscosity. The method can also include receiving data characterizing a Koval factor corresponding to the at least one production well, a production drainage volume, an estimated future injection contribution, and an estimated rate of future fluid production. The production drainage volume can characterize a volume of water received in a pore drainage volume of the at least one production well, and the estimated future injection contribution can characterize an estimated amount of water that will be delivered to the at least one production well. The method can further include determining an estimated rate of future oil production from the at least one production well by applying the data characterizing the emulsion viscosity, the Koval factor, the production drainage volume, the estimated future injection contribution, and the estimated rate of future fluid production, within a first Koval fractional flow model. The method can further include providing the estimated rate of future oil production.

One or more of the following features can be included in any feasible combination. In some embodiments, the method can further include receiving injection plan data that can characterize a hypothetical rate of steam injection into the at least one injection well. The method can further include receiving data characterizing a fluid flow potential and at least one connectivity vector. The fluid flow potential can characterize a reservoir response to steam injection, and the at least one connectivity vector can characterize a fraction of steam injected into the at least one injection well that contributes to production of the fluid. The method can also include determining an estimated rate of future fluid production from the at least one production well. The estimated rate of future fluid production can be determined by applying the injection plan data, and data characterizing the at least one connectivity vector and the fluid flow potential, within a first capacitance resistance model. The method can further include determining the estimated future injection contribution using data characterizing the hypothetical rate of steam injection and the at least one connectivity vector.

In some embodiments, the method can include receiving data characterizing at least one optimization objective. The method can also include determining an injection plan that includes instructions for generating steam and instructions for delivering the steam, based on data characterizing the at least one optimization objective, the estimated rate of future oil production, and the estimated rate of future fluid production. The instructions for generating the steam can include data characterizing an amount of steam to generate, a temperature of the steam, time periods in which steam is to be generated, steam generation rates, and a vapor quality of the steam. The instructions for delivering the steam can include data characterizing an updated hypothetical rate of steam injection, time periods for steam to be injected, and a distribution of steam to be delivered to the at least one injection well. The method can further include delivering data characterizing the instructions for generating steam to a steam generator of the SAGD system, generating steam based on the instructions for generating steam, and delivering data characterizing the instructions for delivering the steam to a distributor of the SAGD system. The distributor can be configured to deliver steam to the at least one injection well. The method can further include delivering the steam to the distributor, and delivering the steam to the at least one injection well based on the instructions for delivering the steam.

In some embodiments, the optimization objective can be a steam-to-oil ratio (SOR) characterizing a ratio of a volume of steam injected into the at least one injection well to a volume of oil produced.

In some embodiments, the method can include receiving data characterizing an injection contribution, a calculated rate of fluid production, and the emulsion viscosity. The injection contribution can characterize an amount of water delivered to the at least one production well. The method can also include determining the Koval factor and the production drainage volume by applying the data characterizing the emulsion viscosity, an injection contribution, and a calculated rate of fluid production, within a second Koval fractional flow model. The method can further include providing the Koval factor and the production drainage volume.

In some embodiments, determining the Koval factor and the production drainage volume can include receiving data characterizing an observed rate of oil production, receiving data characterizing an initial Koval factor and an initial pore drainage volume of the reservoir, and determining a calculated rate of oil production by applying data characterizing the initial Koval factor and the initial pore drainage volume within the second Koval fractional flow model. The method can also include comparing the calculated rate of oil production with the observed rate of oil production, and adjusting the initial Koval factor and the pore drainage volume based on difference between the calculated rate of oil production and the observed rate of oil production.

In some embodiments, the method can include receiving data characterizing a rate of steam injection into the at least one injection well, an initial connectivity vector characterizing an initial estimated fraction of steam injected into the at least one injection well that contributes to production of the fluid, and an initial time constant characterizing an initial estimated rate of fluid flow from the at least one injection well to the at least one production well. The method can also include determining the calculated rate of fluid production, the fluid flow potential, the at least one connectivity vector, and the injection contribution, by applying the data characterizing the initial connectivity vector, the initial time constant, and the rate of steam injection, within a second capacitance resistance model.

In some embodiments, determining the fluid flow potential and the at least one connectivity vector can include receiving data characterizing an observed rate of fluid production from the at least one production well, comparing the calculated rate of fluid production with the observed rate of fluid production, and adjusting the initial connectivity vector and the initial time constant based on differences between the calculated rate of fluid production and the observed rate of fluid production.

In some embodiments, at least one of the receiving, determining, and providing can be performed by at least one data processor forming part of at least one computing system.

In another aspect, a non-transitory computer program product is provided having computer readable instructions, which, when executed by at least one data processor forming part of at least one computing system, implement operations which can include receiving operational data characterizing operating parameters of a steam assisted gravity drainage (SAGD) system. The SAGD system can include at least one injection well configured to deliver steam to an oil sands reservoir, and at least one production well configured receive a fluid, which can be a mixture of oil and water from the oil sands reservoir. The operating parameters can include data characterizing a viscosity of an emulsion of bitumen and water, referred to as an emulsion viscosity. The operations can also include receiving data characterizing a Koval factor corresponding to the at least one production well, a production drainage volume, an estimated future injection contribution, and an estimated rate of future fluid production. The production draining volume can characterize a volume of water received in a pore drainage volume of the at least one production well, and the estimated future injection contribution can characterize an estimated amount of water that will be delivered to the at least one production well. The operations can further include determining an estimated rate of future oil production from the at least one production well by applying the data characterizing the emulsion viscosity, the Koval factor, the production drainage volume, the estimated future injection contribution, and the estimated rate of future fluid production, within a first Koval fractional flow model. The operations can further include providing the estimated rate of future oil production.

One or more of the following features can be included in any feasible combination. In some embodiments, the operations can further include receiving injection plan data that can characterize a hypothetical rate of steam injection into the at least one injection well. The operations can further include receiving data characterizing a fluid flow potential and at least one connectivity vector. The fluid flow potential can characterize a reservoir response to steam injection, and the at least one connectivity vector can characterize a fraction of steam injected into the at least one injection well that contributes to production of the fluid. The operations can also include determining an estimated rate of future fluid production from the at least one production well. The estimated rate of future fluid production can be determined by applying the injection plan data, and data characterizing the at least one connectivity vector and the fluid flow potential, within a first capacitance resistance model. The operations can further include determining the estimated future injection contribution using data characterizing the hypothetical rate of steam injection and the at least one connectivity vector.

In some embodiments, the operations can include receiving data characterizing at least one optimization objective. The operations can also include determining an injection plan that includes instructions for generating steam and instructions for delivering the steam, based on data characterizing the at least one optimization objective, the estimated rate of future oil production, and the estimated rate of future fluid production. The instructions for generating the steam can include data characterizing an amount of steam to generate, a temperature of the steam, time periods in which steam is to be generated, steam generation rates, and a vapor quality of the steam. The instructions for delivering the steam can include data characterizing an updated hypothetical rate of steam injection, time periods for steam to be injected, and a distribution of steam to be delivered to the at least one injection well. The operations can further include delivering data characterizing the instructions for generating steam to a steam generator of the SAGD system, generating steam based on the instructions for generating steam, and delivering data characterizing the instructions for delivering the steam to a distributor of the SAGD system. The distributor can be configured to deliver steam to the at least one injection well. The operations can further include delivering the steam to the distributor, and delivering the steam to the at least one injection well based on the instructions for delivering the steam.

In some embodiments, the optimization objective can be a steam-to-oil ratio (SOR) characterizing a ratio of a volume of steam injected into the at least one injection well to a volume of oil produced.

In some embodiments, the operations can include receiving data characterizing an injection contribution, a calculated rate of fluid production, and the emulsion viscosity. The injection contribution can characterize an amount of water delivered to the at least one production well. The operations can also include determining the Koval factor and the production drainage volume by applying the data characterizing the emulsion viscosity, an injection contribution, and a calculated rate of fluid production, within a second Koval fractional flow model. The operations can further include providing the Koval factor and the production drainage volume.

In some embodiments, determining the Koval factor and the production drainage volume can include receiving data characterizing an observed rate of oil production, receiving data characterizing an initial Koval factor and an initial pore drainage volume of the reservoir, and determining a calculated rate of oil production by applying data characterizing the initial Koval factor and the initial pore drainage volume within the second Koval fractional flow model. The operations can also include comparing the calculated rate of oil production with the observed rate of oil production, and adjusting the initial Koval factor and the pore drainage volume based on difference between the calculated rate of oil production and the observed rate of oil production.

In some embodiments, the operations can include receiving data characterizing a rate of steam injection into the at least one injection well, an initial connectivity vector characterizing an initial estimated fraction of steam injected into the at least one injection well that contributes to production of the fluid, and an initial time constant characterizing an initial estimated rate of fluid flow from the at least one injection well to the at least one production well. The operations can also include determining the calculated rate of fluid production, the fluid flow potential, the at least one connectivity vector, and the injection contribution, by applying the data characterizing the initial connectivity vector, the initial time constant, and the rate of steam injection, within a second capacitance resistance model.

In some embodiments, determining the fluid flow potential and the at least one connectivity vector can include receiving data characterizing an observed rate of fluid production from the at least one production well, comparing the calculated rate of fluid production with the observed rate of fluid production, and adjusting the initial connectivity vector and the initial time constant based on differences between the calculated rate of fluid production and the observed rate of fluid production.

In another aspect, a system is provided having at least one data processor and memory coupled to the processor. The memory can store executable instructions, which, when executed by the at least one data processor, implement operations which can include receiving operational data characterizing operating parameters of a steam assisted gravity drainage (SAGD) system. The SAGD system can include at least one injection well configured to deliver steam to an oil sands reservoir, and at least one production well configured receive a fluid, which can be a mixture of oil and water from the oil sands reservoir. The operating parameters can include data characterizing a viscosity of an emulsion of bitumen and water, referred to as an emulsion viscosity. The operations can also include receiving data characterizing a Koval factor corresponding to the at least one production well, a production drainage volume, an estimated future injection contribution, and an estimated rate of future fluid production. The production drainage volume can characterize a volume of water received in a pore drainage volume of the at least one production well, and the estimated future injection contribution can characterize an estimated amount of water that will be delivered to the at least one production well. The operations can further include determining an estimated rate of future oil production from the at least one production well by applying the data characterizing the emulsion viscosity, the Koval factor, the production drainage volume, the estimated future injection contribution, and the estimated rate of future fluid production, within a first Koval fractional flow model. The operations can further include providing the estimated rate of future oil production.

One or more of the following features can be included in any feasible combination. In some embodiments, the operations can further include receiving injection plan data that can characterize a hypothetical rate of steam injection into the at least one injection well. The operations can further include receiving data characterizing a fluid flow potential and at least one connectivity vector. The fluid flow potential can characterize a reservoir response to steam injection, and the at least one connectivity vector can characterize a fraction of steam injected into the at least one injection well that contributes to production of the fluid. The operations can also include determining an estimated rate of future fluid production from the at least one production well. The estimated rate of future fluid production can be determined by applying the injection plan data, and data characterizing the at least one connectivity vector and the fluid flow potential, within a first capacitance resistance model. The operations can further include determining the estimated future injection contribution using data characterizing the hypothetical rate of steam injection and the at least one connectivity vector.

In some embodiments, the operations can include receiving data characterizing at least one optimization objective. The operations can also include determining an injection plan that includes instructions for generating steam and instructions for delivering the steam, based on data characterizing the at least one optimization objective, the estimated rate of future oil production, and the estimated rate of future fluid production. The instructions for generating the steam can include data characterizing an amount of steam to generate, a temperature of the steam, time periods in which steam is to be generated, steam generation rates, and a vapor quality of the steam. The instructions for delivering the steam can include data characterizing an updated hypothetical rate of steam injection, time periods for steam to be injected, and a distribution of steam to be delivered to the at least one injection well. The operations can further include delivering data characterizing the instructions for generating steam to a steam generator of the SAGD system, generating steam based on the instructions for generating steam, and delivering data characterizing the instructions for delivering the steam to a distributor of the SAGD system. The distributor can be configured to deliver steam to the at least one injection well. The operations can further include delivering the steam to the distributor, and delivering the steam to the at least one injection well based on the instructions for delivering the steam.

In some embodiments, the optimization objective can be a steam-to-oil ratio (SOR) characterizing a ratio of a volume of steam injected into the at least one injection well to a volume of oil produced.

In some embodiments, the operations can include receiving data characterizing an injection contribution, a calculated rate of fluid production, and the emulsion viscosity. The injection contribution can characterize an amount of water delivered to the at least one production well. The operations can also include determining the Koval factor and the production drainage volume by applying the data characterizing the emulsion viscosity, an injection contribution, and a calculated rate of fluid production, within a second Koval fractional flow model. The operations can further include providing the Koval factor and the production drainage volume.

In some embodiments, determining the Koval factor and the production drainage volume can include receiving data characterizing an observed rate of oil production, receiving data characterizing an initial Koval factor and an initial pore drainage volume of the reservoir, and determining a calculated rate of oil production by applying data characterizing the initial Koval factor and the initial pore drainage volume within the second Koval fractional flow model. The operations can also include comparing the calculated rate of oil production with the observed rate of oil production, and adjusting the initial Koval factor and the pore drainage volume based on difference between the calculated rate of oil production and the observed rate of oil production.

In some embodiments, the operations can include receiving data characterizing a rate of steam injection into the at least one injection well, an initial connectivity vector characterizing an initial estimated fraction of steam injected into the at least one injection well that contributes to production of the fluid, and an initial time constant characterizing an initial estimated rate of fluid flow from the at least one injection well to the at least one production well. The operations can also include determining the calculated rate of fluid production, the fluid flow potential, the at least one connectivity vector, and the injection contribution, by applying the data characterizing the initial connectivity vector, the initial time constant, and the rate of steam injection, within a second capacitance resistance model.

In some embodiments, determining the fluid flow potential and the at least one connectivity vector can include receiving data characterizing an observed rate of fluid production from the at least one production well, comparing the calculated rate of fluid production with the observed rate of fluid production, and adjusting the initial connectivity vector and the initial time constant based on differences between the calculated rate of fluid production and the observed rate of fluid production.

DETAILED DESCRIPTION

Certain exemplary embodiments will now be described to provide an overall understanding of the principles of the structure, function, manufacture, and use of the systems, devices, and methods disclosed herein. One or more examples of these embodiments are illustrated in the accompanying drawings.

Steam assisted gravity drainage (SAGD) is an enhanced oil recovery technique that can be used in the production of heavy crude oil or bitumen from oil sands. The technique can involve drilling a pair of horizontal wells into an oil sand reservoir. The well pair can include an injection well and a production well below the injection well. Steam can be injected into the injection well, and the steam permeates through a portion of the reservoir to form a steam chamber. Heat from the steam can reduce the viscosity of the heavy crude oil and/or bitumen, which allows it to flow into the production well. The production well can collect a mixture of the heated heavy crude oil and/or bitumen, as well as formation water and water condensed from the steam. The mixture may be pumped through a flow meter to the surface, where the heavy crude oil and/or bitumen are separated from the mixture.

As described above, the cost of heating water to produce the steam for SAGD operations can represent a significant portion of the total operating cost of the operation. Computer generated models (e.g., 3-dimensional models) of the wells and/or the well pad can be used in an attempt to optimize steam resource allocation, however, the models are complex and involve a relatively high number of variables. Accordingly, methods and systems are provided to optimize amounts of steam delivered to injection wells of SAGD systems. In some cases, operational parameters such as, e.g., a value of viscosity of the mixture of oil-based material and water within a SAGD reservoir, can be applied within mathematical models to optimize amounts of steam provided to injection wells. By applying the value of viscosity within the mathematical models, resource allocation can be optimized to reduce steam demands, increase oil production, increase favorable well pairs, improve temperature control within the reservoir, enhance diluent management, and provide operational notifications to a user device.

Figure 1:
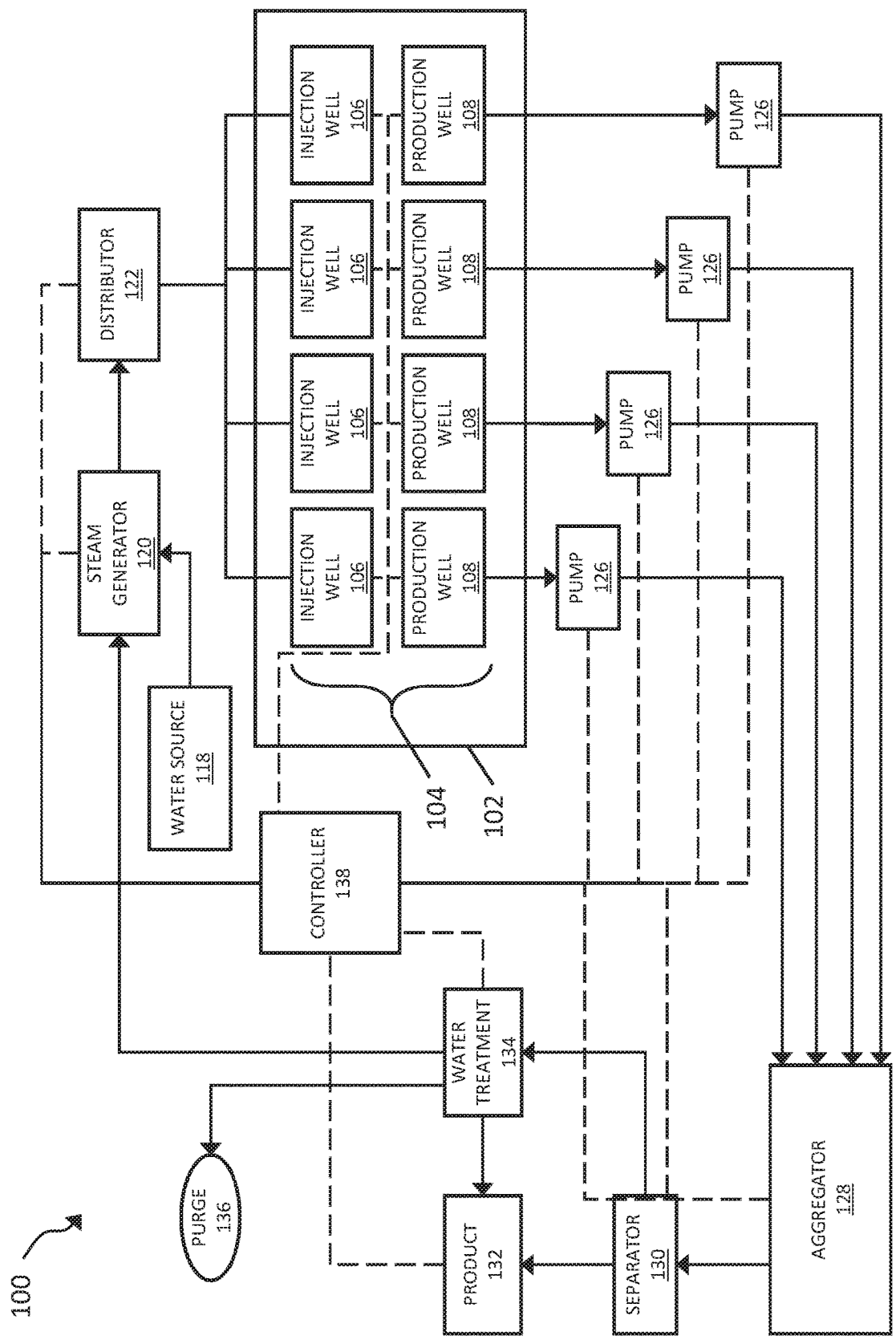
FIG. 1 is a block diagram of an exemplary embodiment of a steam assisted gravity drainage (SAGD) system.
Figure 2:
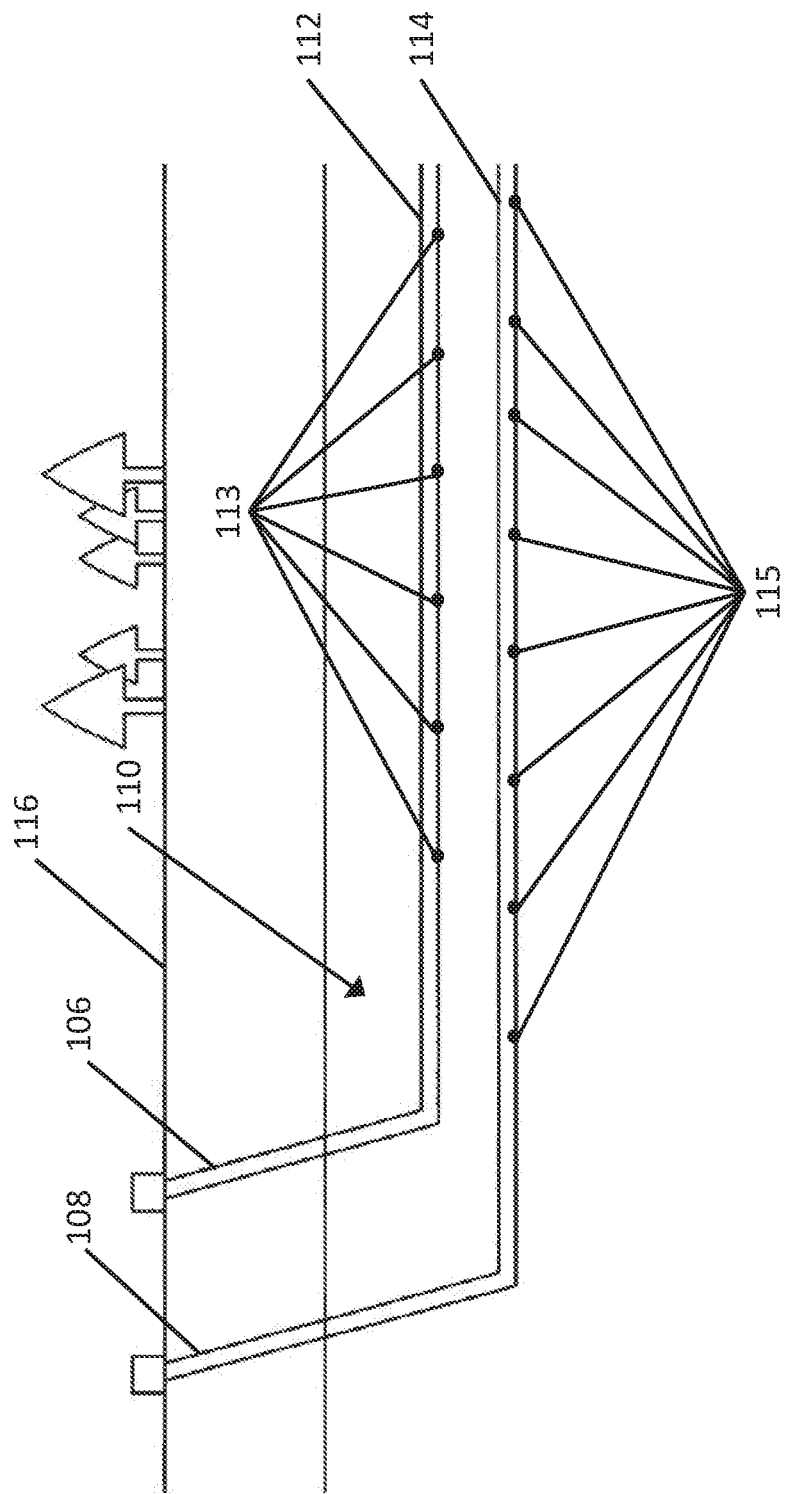
FIG. 2 is a side cross-sectional view of a well pair of the SAGD system shown in FIG. 1.
Figure 3:
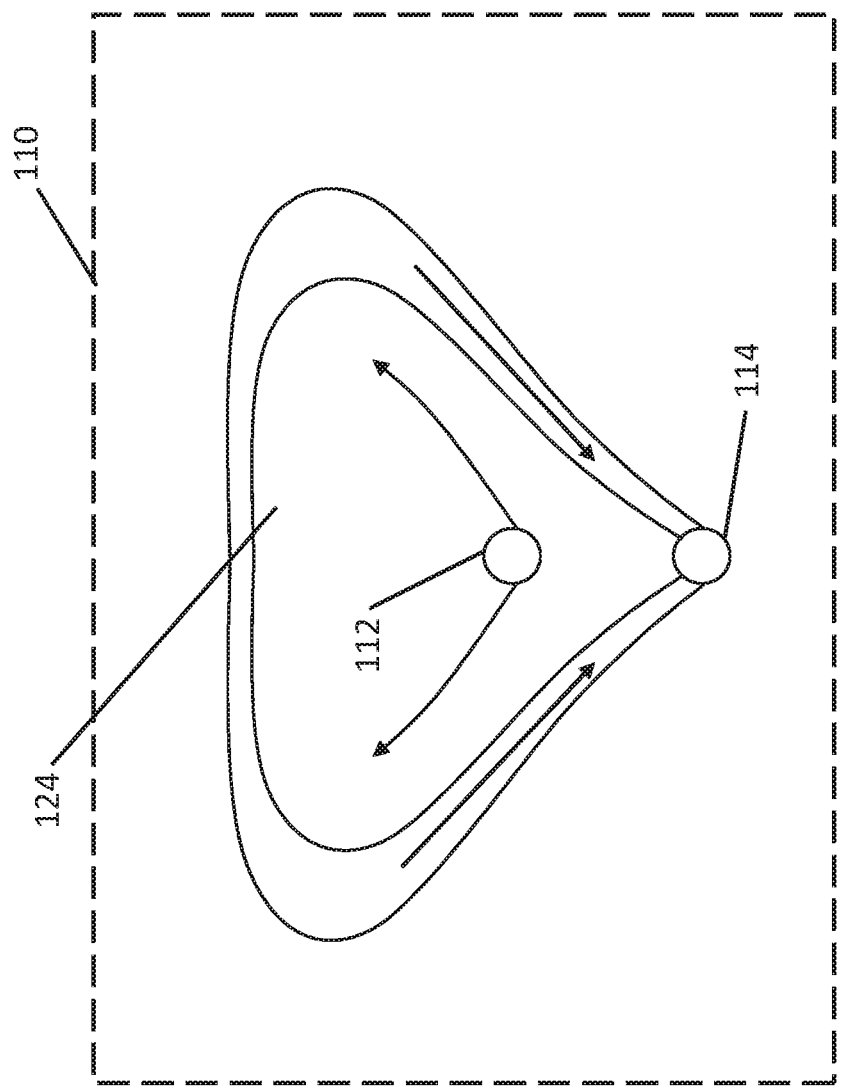
FIG. 3 is an end cross-sectional view of the well pair shown in FIG. 2.

FIG. 1 shows an exemplary embodiment of a SAGD system 100 configured to extract oil-based materials (e.g., heavy crude oil and/or bitumen) from underground reservoirs. In the illustrated embodiment, the SAGD system 100 includes a well pad 102 that has multiple well pairs 104. Each well pair 104 includes an injection well 106 configured to deliver steam to an oil sands reservoir, and a production well 108 configured receive a mixture of oil/bitumen and water. Referring to FIGS. 2-3, the injection and production wells 106, 108 can be drilled down into terrain of the well pad 102 until respective designated well depths (e.g., 100 meters or more) are achieved, such that the wells 106, 108 extend into a subterranean oil sands reservoir 110. At the designated well depths, the wells 106, 108 can be drilled approximately horizontally to form horizontal portions 112, 114 of the wells 106, 108 within the subterranean oil sands reservoir 110. The horizontal portion 112 of the injection well 106 can be disposed above, for example, vertically above the horizontal portion 114 of the production well 108, below a ground surface 116 (shown in FIG. 2). As an example, injection well 106 can be 1-10 meters above production well 108. The subterranean oil sands reservoir 110 can include an extractable oil-based material such as, e.g., heavy crude oil and/or bitumen. In some cases, temperature sensors 113, 115 can be distributed along walls of the horizontal portions 112, 114. The temperature sensors 113, 115 can be configured to measure temperatures of fluids exiting the injection wells 106 and entering the production wells 108, respectively.

Referring to FIG. 1, the SAGD system 100 can include a water source 118, which can be configured to provide water to a steam generator 120. The steam generator 120 can be configured to heat the water from the water source 118 to generate steam, and provide the steam to a distributor 122. The steam generator 120 can include at least one data processor configured to control operation of the steam generator 120. The steam generator 120 can include at least one sensor configured to measure temperature, pressure, quality, amounts, and/or flow rates of steam delivered to the distributor 122. The distributor 122 can be configured to distribute the steam among the injection wells 106. The distributor 122 can include at least one data processor configured to control operation of the distributor 122. The distributor 122 can also include at least one sensor configured to measure temperature, pressure, quality, amounts, and/or flow rates of steam delivered to each of the injection wells 106. The steam can flow through the injection wells 106 and can be injected into the subterranean oil sands reservoir 110. The injected steam can form a steam chamber 124, shown in FIG. 3, which can increase in size, both vertically and horizontally, over time. The heat from the steam can reduce the viscosity of the oil-based material (e.g., heavy crude oil and/or bitumen), which allows the oil-based material to flow into the horizontal portion 114 of the production well 108. In some embodiments, the distributor 122 can maintain pressures of steam within the injection wells 106 to be within a designated operating range. For example, the operating range of the pressure can be low enough to maintain structural integrity of the subterranean oil sands reservoir 110, and high enough to allow the steam to penetrate into the subterranean oil sands reservoir 110 to form the steam chamber 124.

As the steam transfers heat to the oil-based material within the steam chamber 124, the steam can condense. A mixture of the oil-based material (e.g., heavy crude oil and/or bitumen), formation water, and water condensate from the steam can be collected in the horizontal portions 114 of the production wells 108. In some cases, depending on the configuration of the wells 106, 108, subterranean geology, and other operating parameters (e.g., rates of steam injection), each injection well 106 can contribute to fluid production (e.g., production of a mixture of heavy crude oil and/or bitumen and water) in more than one production well 108. The mixture can be recovered from the production wells 108 using one or more pumps 126, which can be configured to deliver the mixture to an aggregator 128, which can be a container such as, e.g., a tank. The pumps 126 can be, e.g., progressive cavity pumps, electric submersible pumps, or the like, and can be configured to propel high-viscosity fluids and suspended solids. The pumps 126 can include sensors that can be configured to measure amounts and/or flow rates of the mixture that are pumped from each production well 108. The sensors can be upstream, downstream, adjacent to, and/or part of, the pumps 126. The aggregator 128 can include sensors that can measure an amount of the mixture within the aggregator 128. The sensors can be upstream, downstream, adjacent to, and/or part of, the aggregator 128.

The aggregator 128 can provide the mixture to a separator 130, which can be configured to separate the oil-based material from other components (e.g., water and/or suspended solids) of the mixture. As an example, the separator 130 can include filters, separation vessels, gas flotation vessels, and the like, such that it can separate the oil-based material from the other components of the mixture. The separator 130 can deliver the separated oil-based material to a product tank 132, and can deliver the remaining components of the mixture to a water treatment system 134. The separator 130 can include sensors that can be configured to measure amounts and/or flow rates of the mixture provided by the aggregator 128. In some embodiments, the separator 130 can include sensors that can be configured to measure amounts of the oil-based material delivered to the product tank 132, as well as amounts and/or flow rates of the remaining components of the mixture that are delivered to the water treatment system 134. The product tank 132 can include sensors that can be configured to measure amounts and/or flow rates of the oil-based material provided by the separator 130. The water treatment system 134 can include sensors configured to measure amounts and/or flow rates of the remaining components of the mixture provided by the separator 130. In some cases, the remaining components of the mixture that are delivered to the water treatment system 134 can include some bitumen/oil that was not separated by the separator 130. The water treatment system 134 can be configured to separate the remaining oil-based material from the mixture, e.g., via filtering, chemical processing, gas flotation, other evaporative processes, and the like. Oil-based material that is separated from the mixture at the water treatment system 134 can be delivered to the product tank 132. The water treatment system 134 can also be configured to separate water from other components (e.g., suspended solids). Some of the separated water can be delivered back to the steam generator 120 to supplement water provided by the water source 118. Another portion of the mixture, which can include some water and/or solid material, can be delivered to a purge 136 to be released into a body of water, or pumped underground. The water treatment system 134 can include sensors that can be configured to measure amounts of water delivered to the steam generator 120, and amounts of water and/or solid material delivered to the purge 136.

The SAGD system 100 can also include a controller 138, which can include at least one data processor. The controller 138 can be configured to monitor various aspects of oil production, forecast future mixture and oil production, control resource (e.g., steam) allocation, and determine and optimize injection plans based on an optimization objective. As shown in the illustrated example, the controller 138 can be coupled to the injection wells 106, productions wells 108, steam generator 120, distributor 122, pumps 126, aggregator 128, separator 130, product tank 132, and water treatment system 134. As an example, the controller 138 can control an amount of steam generated, as well as the rate that steam is generated by the steam generator 120. The controller 138 can provide instructions to the distributor 122 to control quantities, flow rates, pressures, and quality, of steam delivered to each injection well 106. In some embodiments, the pumps 126 can include sensors, which can measure amounts of the mixture that are pumped from each production well 108. The pumps 126 can provide data to the controller 138 characterizing amounts, and/or flow rates, of the mixture that are pumped from each production well 108.

The controller 138 can also receive temperature data characterizing temperature measurements from the sensors 113, 115. In some cases, a "sub-cool" can be utilized to ensure that steam from the injection wells 106 does not enter the production wells 108. The sub-cool can be a prescribed operational temperature difference between fluids exiting the injection wells 106 and fluids entering the production wells 108. In some cases, the sub-cool can be in a range of approximately 8-20° C., such that temperatures of fluids entering the production wells 108 are lower than temperatures of fluids exiting the injection wells 106. In some cases, if the sub-cool is not maintained, a steam breakthrough can occur in a production well, which can be detrimental to operation of the SAGD system. By measuring the temperatures of the fluids exiting the injection wells 106 and entering the production wells 108, the controller 138 can provide instructions to the steam generator 120 and distributor 122 to ensure that the sub-cool is maintained.

The aggregator 128 can provide data to the controller 138 characterizing total amounts, and/or flow rates, of the mixture received from the pumps 126. The separator 130 can provide data to the controller 138 characterizing amounts, and/or flow rates, of the mixture provided by the aggregator 128. In some embodiments, the separator 130 can be configured to provide data to the controller 138 characterizing amounts, and/or flow rates, of the oil-based material delivered to the product tank 132, as well as amounts, and/or flow rates, of the remaining components of the mixture that are delivered to the water treatment system 134. The product tank 132 can be configured to provide data to the controller 138 characterizing amounts, and/or flow rates, of the oil-based material provided by the separator 130. The water treatment system 134 can be configured to provide data to the controller 138 characterizing amounts, and/or flow rates, of water delivered to the steam generator 120, and water and/or solid material delivered to the purge 136. The steam generator 120 can be configured to provide data to the controller 138 characterizing temperature, pressure, quality, amounts, and/or flow rates, of steam delivered to the distributor 122. The distributor 122 can be configured to provide data to the controller 138 characterizing temperature, pressure, quality, amounts, and/or flow rates, of steam delivered each of the injection wells 106.

Figure 4:
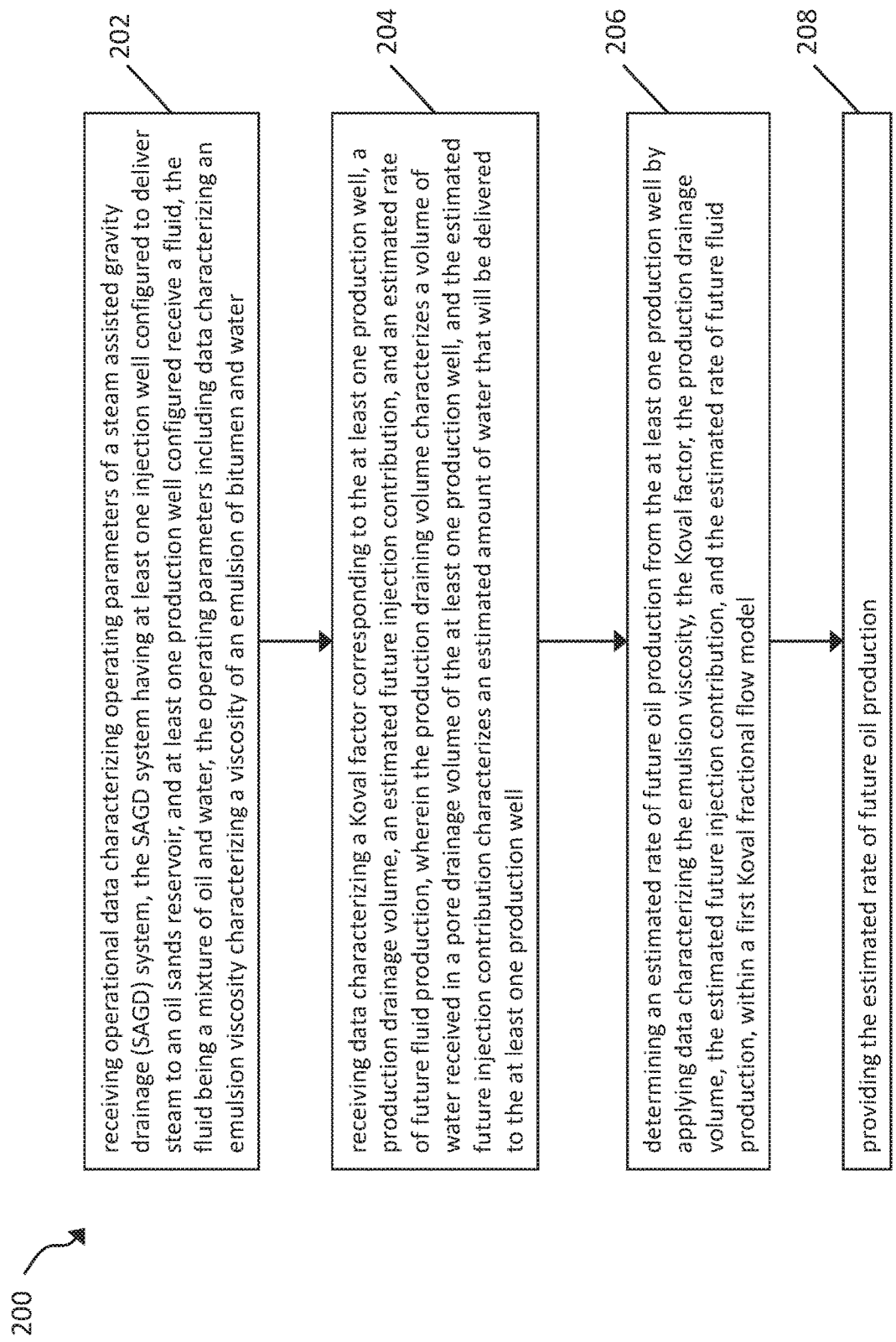
FIG. 4 is a flow chart of an exemplary method for estimating a rate of future oil production, and for providing data characterizing the estimated rate of future oil production.

In some embodiments a controller (e.g., controller 138) can be configured to estimate a rate of future oil production corresponding to at least one production well (e.g., production well 108), and to provide data characterizing the estimated rate of future oil production, by utilizing a capacitance resistance model (CRM) combined with a Koval fractional flow model. The CRM can describe relationships between injection wells (e.g., injection wells 106) and production wells (e.g., production wells 108), including connectivity between the injection wells and the production wells. As an example, as described herein, the CRM model can describe relationships between rates of steam injected into injection wells, and amounts of mixture produced from production wells, based on connectivity between injection wells and production wells. The Koval fractional flow model can describe heterogeneity of mixtures delivered to the at least one production well, and can be used to determine relationships between amounts of mixture produced and amounts of oil-based material produced. FIG. 4 illustrates a flow chart of an exemplary method 200 for estimating a rate of future oil production, and for providing data characterizing the estimated rate of future oil production.

As shown at step 202, the method can include receiving operational data characterizing operating parameters of a steam assisted gravity drainage (SAGD) system (e.g. SAGD system 100). The SAGD system can include at least one injection well (e.g., injection well 106) configured to deliver steam to an oil sands reservoir, and at least one production well (e.g., production well 108) configured receive a fluid, which can be a mixture of an oil-based material (e.g., heavy crude oil and/or bitumen) and water. The operating parameters can include data characterizing an emulsion viscosity. The emulsion viscosity can characterize an effective viscosity of an emulsion of an oil-based material and water delivered to the production well. For example, mixtures of oil-based material and water delivered to each of the at least one production wells can have a corresponding emulsion viscosity. In some cases, the emulsion viscosities corresponding to the mixtures delivered to each of the at least one production wells can be different. The emulsion viscosities corresponding to each of the at least one production wells can also change, depending on temperature, flow rate, and/or quality of steam delivered to the at least one injection well that contributes to the mixture delivered to the at least one production well. The emulsion viscosity can also change depending on relative amounts of water and oil-based material delivered to the production well. For example, as a steam chamber (e.g., steam chamber 124) develops, and/or as oil-based material is extracted from the reservoir, an amount of water within a given volume of the mixture can increase. Therefore, the emulsion viscosity can approach the viscosity of water. In some cases, the emulsion viscosity can change as a result of saturation and/or changes in pressure within the oil sands reservoir as the reservoir is depleted.

As shown at step 204, the method can include receiving data characterizing a Koval factor corresponding to the at least one production well, a production drainage volume, an estimated future injection contribution, and an estimated rate of future fluid production (e.g., production of a mixture of oil-based material and water). As an example, the data processor of the controller can receive the data. The production drainage volume can characterize a volume of water received in a pore drainage volume of the at least one production well, and the estimated future injection contribution can characterize an estimated amount of water that will be delivered to the at least one production well.

At step 206, an estimated rate of future oil production from the at least one production well can be determined by applying data characterizing the emulsion viscosity, the Koval factor, the production drainage volume, the estimated future injection contribution, and the estimated rate of future fluid production, within a first Koval fractional flow model.

At step 208, the estimated rate of future oil production can be provided. For example, the estimated rate of future oil production can be provided to a user. As another example, the estimated rate of future oil production can be applied within further analysis to optimize an amount of steam injected into the at least one injection well.

The combined CRM and Koval fractional flow models are described below in Eqs. (1)-(14). One form of the CRM for determining an amount of fluid production (e.g., production of a mixture of oil-based material and water) from production wells is shown below in Eq. (1).

$$q_{t,j}^k = q_{t,j}^{k-1} e^{\frac{-\Delta t_k}{\tau_j}} + \left(1 - e^{\frac{-\Delta t_k}{\tau_j}}\right)\left(\sum_i^{n_j} f_{ij} I_i^k\right) \qquad (1)$$

The subscripts i, j, and k identify individual injection wells, production wells, and time steps, respectively. $q_{t,j}^k$ is a total fluid (e.g., a mixture of oil-based material and water) production from production well j at time step k. $I_i^k$ is a rate of steam injected into injection well i at time step k. $n_j$ is the total number of injection wells on a well pad. $f_{ij}$ is a connectivity, which can be a vector, between injection well i and production well j. The connectivity can characterize a fraction of steam injected into injection well i that contributes to production of the mixture at production well j. $\Delta t_k$ is a length of time between time step k−1 and k. $q_{t,j}^{k-1}$ is a total fluid production from production well j at time step k−1. $\tau_j$ is a time constant for producer j. The time constant $\tau_j$, also referred to as a fluid flow potential, characterizes an amount of time it takes for a pressure wave to travel from injection wells to the production well j. The fluid flow potential $\tau_j$ can also characterize a reservoir response to steam injection at a given pressure, and a corresponding fluid production. $\tau_j$ is given by:

$$\tau_j = \left(\frac{V_p c_t}{J_t}\right)_j. \tag{2}$$

$V_p$ is a drainage pore volume of production well j. $c_t$ is a total compressibility of the mixture of oil-based material and water at production well j. $J_t$ is a total productivity index of production well j.

Eqs. (1)-(2) of the CRM can be combined with the Koval fractional flow equation, given by Eq. (3).

$$f_{w,j}^k = \begin{cases} 0, & t_{D,j} < \frac{1}{K_{val,j}} \\ \frac{K_{val,j} - \sqrt{\frac{K_{val,j}}{t_{D,j}}}}{K_{val,j} - 1}, & \frac{1}{K_{val,j}} < t_{D,j} < K_{val,j} \\ 1, & t_{D,j} > K_{val,j} \end{cases} \tag{3}$$

$f_{w,j}^k$ is a water cut in production well j at time step k. The water cut characterizes a fraction of the total mixture that is water. $t_{D,j}$ is a dimensionless time, also referred to as a production drainage volume. The production drainage volume $t_{D,j}$ characterizes a volume of water received in drainage pore volume $V_{P,j}$. $K_{val,j}$ is a Koval factor for production well j. The Koval factor $K_{val,j}$ can characterize both reservoir (e.g., reservoir 110) heterogeneity, and an effective viscosity ratio.

The Koval factor $K_{val,j}$ is given below in Eq. (4).

$$K_{val,j} = H_K E = H_K \left[0.78 + 0.22\left(\frac{\mu_o}{\mu_s}\right)\right] \tag{4}$$

$H_K$ is a measure of reservoir heterogeneity, E is an effective viscosity ratio, $\mu_o$ is an oil viscosity, and $\mu_s$ is a solvent viscosity. For a SAGD system, an emulsion viscosity $\mu_{e,j}$ can be used in place of ratio of $\mu_o/\mu_s$. The emulsion viscosity $\mu_{e,j}$ can characterize an effective viscosity of the mixture of oil-based material and water. Therefore, the Koval factor $K_{val,j}$ is given by:

$$K_{val,j} = H_K E_j = H_K [0.78 + 0.22(\mu_{e,j})]. \tag{5}$$

The production drainage volume $t_{D,j}$ is given in Eq. (6).

$$t_{D,j} = \frac{\sum_k I_{t,j}^k}{V_{P,j}} \tag{6}$$

$I_{t,j}^k$ is an injection contribution characterizing an amount of water that is delivered to production well j at time step k. The injection contribution $I_{t,j}^k$ can be given by:

$$I_{t,j}^k = \left(\sum_i f_{ij} I_i^k\right) \Delta t_k. \tag{7}$$

By applying Eq. (7) within Eq. (6), the production drainage volume $t_{D,j}$, which can be referred to as a hydrocarbon pore volume, is found to be given by:

$$t_{D,j} = \frac{\sum_k \sum_i f_{ij} I_i^k}{V_{P,j}}. \tag{8}$$

An amount of oil-based material produced by production well j at time step k is given by:

$$q_{o,j}^k = q_{t,j}^k f_{w,j}^k. \tag{9}$$

The model parameters $f_{ij}$, $\tau_j$, $K_{val,j}$, $V_{p,j}$ can be determined by solving the objective function shown in Eq. (10) using, e.g., a least square error method.

$$\min z = \sum_{k=1}^{n_t} \sum_{j=1}^{n_p} \left[\left(q_{t,j}^{k,cal} - q_{t,j}^{k,obs}\right)^2 + \left(q_{o,j}^{k,cal} - q_{o,j}^{k,obs}\right)^2\right] \tag{10}$$

The boundary conditions to the objective function are given in Eqs. (11)-(14).

$$\tau_j, f_{ij} \geq 0 \tag{11}$$

$$\sum_{j=1}^{n_p} f_{ij} \begin{cases} < 1, & \text{if injection loss exists} \\ = 1, & \text{if no injection loss} \end{cases} \tag{12}$$

Injection loss can describe a condition in which a portion of the steam injected into an injection well is not recovered by a production well (e.g., in the form of condensed water).

$$K_{val,j} \geq 0 \tag{13}$$

$$\sum_{j=1}^{n_p} V_{P,j} \leq V_{P,Field} \tag{14}$$

$V_{P,Field}$ is the total pore volume of the field.

Figure 5:
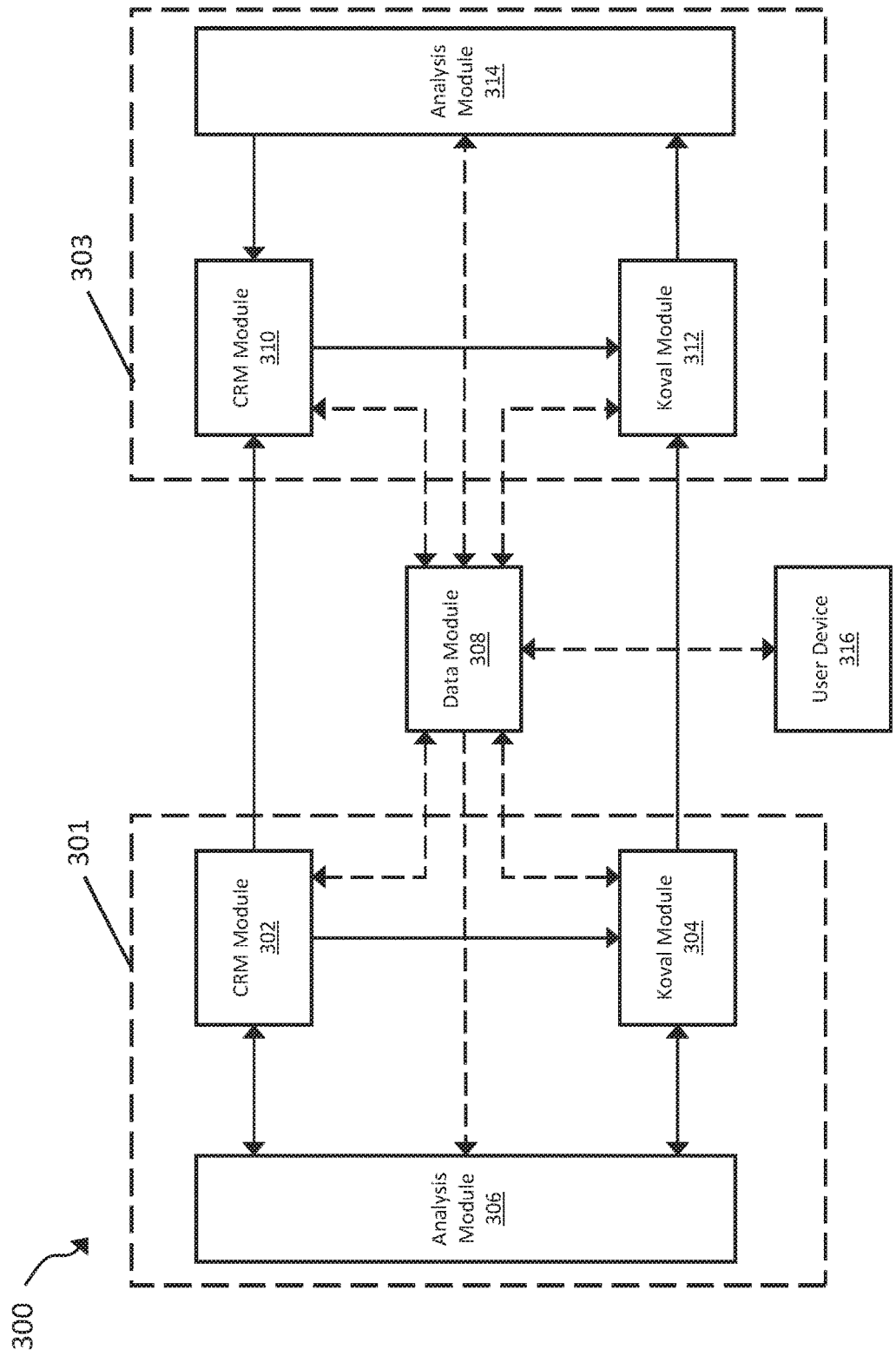
FIG. 5 is a functional block diagram illustrating a method for estimating a rate of future oil production corresponding to at least one production well and optimizing resource allocation to injection wells of a SAGD system.

FIG. 5 shows a functional block diagram 300 illustrating a process that can be used to estimate a rate of future oil production corresponding to at least one production well (e.g., production well 108), and optimize resource (e.g., steam) allocation in injection wells, by utilizing a capacitance resistance model (CRM) combined with a Koval fractional flow model.

The functional block diagram 300 includes a history matching module 301 and an optimization module 303. The history matching module 301 can be configured to determine connectivity $f_{ij}$, fluid flow potential $\tau_j$, Koval factor $K_{val,j}$ and production drainage volume $t_{D,j}$, using a history matching technique. The optimization module 303 can be configured to determine an estimated rate of future fluid production $q_{t,j}^{k,F}$, as well as an estimated rate of future oil production $q_{o,j}^{k,F}$. The optimization module 303 can also be configured to determine an injection plan based on an optimization objective. In some cases, the injection plan can include data characterizing amounts of steam to deliver to the injection wells, time periods for steam to be injected, vapor qualities of the steam, and rates of steam injection into the injection wells. The optimized injection plan allows SAGD systems to maximize production, and minimize costs associated with steam generation. In some cases, steam can be preferentially allocated to well pairs that produce more oil-based material than other well pairs. In some embodiments, the process can be implemented on a data processor of a controller (e.g. controller 138) of a SAGD system (e.g., SAGD system 100).

As shown in the illustrated embodiment, the history matching module 301 can include a CRM module 302, a Koval module 304, and an analysis module 306. The CRM module 302 can be configured to determine a calculated rate of fluid production $q_{t,j,TH}^{k}$ and an injection contribution $I_{t,j}^{k}$. For example the CRM module 302 can receive data characterizing a rate of steam injection $I_{i}^{k}$ into at least one injection well and a time step size $\Delta t_k$ from a data module 308. The data module 308 can be configured to store, provide, and/or deliver data related to production of oil-based material, also referred to as oil, and/or model parameters associated with the SAGD system. The analysis module 306 can provide data to the CRM module 302 characterizing an initial connectivity vector $f_{ij,o}$ and an initial fluid flow potential $\tau_{j,o}$. The CRM module 302 can apply the data characterizing the rate of steam injection $I_{i}^{k}$, the initial connectivity vector $f_{ij,o}$, the initial fluid flow potential $\tau_{j,o}$, and the time step size $\Delta t_k$ within a CRM (e.g., the CRM shown in Eq. (1)) to determine a calculated rate of fluid production a $q_{t,j,TH}^{k}$ from the at least one production well. The CRM module 302 can determine the calculated rate of fluid production for multiple time steps k. The CRM module 302 can determine an injection contribution $I_{t,j}^{k}$, e.g., by applying the rate of steam injection $I_{i}^{k}$, the initial connectivity vector $f_{ij,o}$, and the time step size $\Delta t_k$ within Eq. (7).

The CRM module 302 can provide data to the Koval module 304 characterizing the injection contribution $I_{t,j}^{k}$ and the calculated rate of fluid production $q_{t,j}^{k,cal}$. The Koval module 304 can be configured to determine a calculated rate of oil production $q_{o,j}^{k,cal}$, the Koval factor $K_{val,j}$, as well as a production drainage volume $t_{D,j}$. The data module 308 can provide data to the Koval module 304 characterizing an emulsion viscosity $\mu_{e,j}$ for each of the injection wells. The analysis module 306 can provide data to the Koval module 304 characterizing an initial drainage pore volume $V_{p,j,o}$ and an initial Koval factor $K_{val,j,o}$. The Koval module 304 can determine the calculated rate of oil production $q_{o,j}^{k,cal}$, as well as the production drainage volume $t_{D,j}$, by applying data characterizing the injection contribution $I_{t,j}^{k}$, the calculated rate of fluid production $q_{t,j}^{k,cal}$, emulsion viscosity the initial drainage pore volume $V_{p,j,o}$, and the initial Koval factor $K_{val,j,o}$ within a Koval fractional flow model (e.g., shown in Eqs. (3)-(9)).

In some embodiments, the analysis module 306 can provide data to the Koval module 304 characterizing the initial drainage pore volume $V_{p,j,o}$ and an initial reservoir heterogeneity $H_{K,o}$. The Koval module 304 can determine the calculated rate of oil production $q_{o,j}^{k,cal}$, as well as the production drainage volume $t_{D,j}$, by applying data characterizing the injection contribution $I_{t,j}^{k}$, the calculated rate of fluid production $q_{t,j}^{k,cal}$, emulsion viscosity $\mu_{e,j}$, the initial drainage pore volume $V_{p,j,o}$, and the initial reservoir heterogeneity $H_{K,o}$ within a Koval fractional flow model (e.g., shown in Eqs. (3)-(9)).

The CRM module 302 can provide data to the analysis module 306 characterizing the calculated rate of fluid production $q_{t,j}^{k,cal}$. The data can include equations and parameters characterizing the CRM analysis. The Koval module 304 can provide data to the analysis module 306 characterizing the calculated rate of oil production $q_{o,j}^{k,cal}$. The data can include equations and parameters characterizing the Koval fractional flow analysis. The analysis module 306 can receive data from the data module 308 characterizing an observed rate of fluid production $q_{t,j}^{k,obs}$ and an observed rate of oil production $q_{o,j}^{k,obs}$. The analysis module 306 can apply data characterizing the calculated rate of fluid production $q_{t,j}^{k,cal}$ the calculated rate of oil production $q_{o,j}^{k,cal}$, the observed rate of fluid production $q_{t,j}^{k,obs}$, and the observed rate of oil production $q_{o,j}^{k,obs}$, within an objective function (e.g., Eq. (10)) which can be subject to the conditions shown in Eqs. (11)-(14). The analysis module 306 can solve the objective function using, e.g., a least square error approach, to determine adjusted values of parameters $f_{ij,o}$, $\tau_{j,o}$, $K_{val,j,o}$, $V_{p,j,o}$, which can be taken as the true values of the parameters $f_{ij}$, $\tau_{j}$, $K_{val,j}$, $V_{p,j}$. Alternatively, if the analysis module 306 provided an initial reservoir heterogeneity $H_{K,o}$ to the Koval module 304, the analysis module 306 can solve the objective function using, e.g., a least square error approach, to determine adjusted values of parameters $f_{ij,o}$, $\tau_{j,o}$, $H_{K,o}$, $V_{p,j,o}$, which can be taken as the true values of the parameters $f_{ij}$, $\tau_{j}$, $H_{K}$, $V_{p,j}$.

The analysis module 306 can provide data to the Koval module 304 characterizing the parameters $f_{ij}$, $\tau_{j}$ to the CRM module 302, and data characterizing the parameters $K_{val,j}$, $V_{p,j}$, and/or $H_{K}$ to the Koval module 304. The CRM module 302 can apply the data characterizing the rate of steam injection $I_{i}^{k}$, the connectivity vector $f_{ij}$, the fluid flow potential $\tau_{j}$, and the time step size $\Delta t_k$ within a CRM (e.g., the CRM shown in Eq. (1)) to determine a calculated rate of fluid production $q_{t,j,TH}^{k}$ from the at least one production well, as described above. The CRM module 302 can determine an injection contribution $I_{t,j}^{k}$, e.g., by applying the rate of steam injection $I_{i}^{k}$, the connectivity vector $f_{ij}$, and the time step size $\Delta t_k$, within Eq. (7), as described above.

The CRM module 302 can provide data to the Koval module 304 characterizing the injection contribution $I_{t,j}^{k}$, and the calculated rate of fluid production $q_{t,j}^{k,cal}$. The Koval module 304 can determine a production drainage volume $t_{D,j}$ by applying data characterizing the injection contribution $I_{t,j}^{k}$ and the drainage pore volume $V_{p,j}$ within Koval fractional flow model (e.g., using Eqs.(6)). Additionally, a measure of reservoir heterogeneity $H_K$ can be determined, e.g., by applying the Koval factor $K_{val,j}$ and the emulsion viscosity $\mu_{e,j}$ within Eq. (5). In some embodiments, if the analysis module 306 provided an initial reservoir heterogeneity $H_{K,o}$ to the Koval module 304, the Koval factor $K_{val,j}$ can be determined by applying the emulsion viscosity $\mu_{e,j}$ and the reservoir heterogeneity $H_K$ within Eq. (5).

The history matching module 301 can provide data characterizing the parameters $f_{ij}$, $\tau_{j}$, $K_{val,j}$, $V_{p,j}$, $t_{D,j}$, and/or $H_K$ to the optimization module 303. In the illustrated example, the optimization module 303 includes another CRM module 310, Koval module 312, and analysis module 314. The CRM module 310 can be configured to determine an estimated rate of future fluid production $q_{t,j}^{k,F}$ from the at least one production well. For example, the CRM module 302 can provide data to the CRM module 310 characterizing the connectivity vector $f_{ij}$ and the fluid flow potential $\tau_{j}$. The CRM module 310 can also receive injection plan data from a data module 308 characterizing a hypothetical rate of steam injection $I_{i}^{k,H}$ into at least one injection well, as well as a time step size $\Delta t_k$. The CRM module 310 can determine an estimated rate of future fluid production $q_{t,j}^{k,F}$ by applying the data characterizing the hypothetical rate of steam injection $I_i^{k,H}$, the connectivity vector $f_{ij}$, the fluid flow potential $\tau_j$, and the time step size $\Delta t_k$, within a CRM (e.g., the CRM shown in Eq. (1)). The CRM module 310 can determine an estimated future injection contribution $I_{t,j}^{k,F}$ by applying the data characterizing the connectivity vector $f_{ij}$, the hypothetical rate of steam injection $I_i^{k,H}$, and the time step size $\Delta t_k$, within Eq. (7).

The CRM module 310 can provide data to a Koval module 312 characterizing the estimated rate of future fluid production $q_{t,j}^{k,F}$, and the estimated future injection contribution $I_{t,j}^{k,F}$. The Koval module 312 can be configured to determine an estimated rate of future oil production $q_{o,j}^{k,F}$, including an estimated future water cut $f_{w,j}^{k,F}$, from the at least one production well. The Koval module 304 can provide data to the Koval module 312 characterizing the production drainage volume $t_{D,j}$, the drainage pore volume $V_{p,j}$, the Koval factor $K_{val,j}$, and/or the reservoir heterogeneity $H_K$. The data module 308 can provide data to the Koval module 312 characterizing the emulsion viscosity emulsion viscosity $\mu_{e,j}$. The Koval module 312 can determine the estimated rate of future oil production $q_{o,j}^{k,F}$, and the estimated future water cut $f_{w,j}^{k,F}$, by applying data characterizing the estimated future injection contribution $I_{t,j}^{k,F}$, the estimated rate of future fluid production $q_{t,j}^{k,F}$, the emulsion viscosity $\mu_{e,j}$, the production drainage volume $t_{D,j}$, the Koval factor $K_{val,j}$, and/or the reservoir heterogeneity $H_K$ within a Koval fractional flow model (e.g., shown in Eqs. (3)-(9)).

In some embodiments, the hypothetical rate of steam injection $I_i^{k,H}$, including allocation of the steam to individual injection wells, can be optimized based on an optimization objective. For example, an analysis module 314 can be configured to optimize the hypothetical rate of steam injection $I_i^{k,F}$. In some embodiments, the analysis module 314 can receive an optimization objective such as, e.g., data characterizing a net present value and/or production objectives (e.g., a steam-to-oil ratio (SOR)) from the data module 308. The SOR can characterize a ratio of a volume of steam injected into the at least one injection well to a volume of oil produced. The Koval module 312 can provide data to the analysis module 314 characterizing estimated rate of future fluid production $q_{t,j}^{k,F}$, as well as the estimated rate of future oil production $q_{o,j}^{k,F}$. The data can include equations and parameters characterizing the CRM and the Koval fractional flow analysis. Based on the optimization objective, e.g., the SOR, the estimated rate of future fluid production $q_{t,j}^{k,F}$, and/or the estimated rate of future oil production $Q_{o,j}^{k,F}$, the analysis module 314 can determine an injection plan, include hypothetical rates of steam injection $I_i^{k,H}$, as well as steam allocation. For example, in some cases, the injection plan can be determined using an iterative process. In some cases, the injection plan can include instructions for generating steam and instructions for delivering the steam. For example, the instruction for generating the steam can include data characterizing an amount of steam to generate, a temperature of the steam, time periods in which steam is to be generated, steam generation rates, and a vapor quality of the steam. The instructions for delivering the steam can include data characterizing an updated hypothetical rate of steam injection, time periods for steam to be injected, and a distribution of steam to be delivered to the at least one injection well. The updated hypothetical rate of steam injection can be taken to be a new actual rate of steam injection. As an example, the analysis module 314 can provide data characterizing the instructions for generating steam and the instructions for delivering the stream to a stream generator (e.g., steam generator 120) and a distributor (e.g., distributor 122), respectively. The steam generator can generate steam based on the instructions or generating the steam, and can provide the steam to the distributor. The distributor can deliver the steam to the injection wells of the SAGD system based on the instructions for delivering the steam.

In some cases, the analysis module 314 can provide data characterizing the injection plan to the data module 308. The data module 308 can provide data characterizing the injection plan to a user device 316 to allow the user to execute the injection plan. The user device 316 can receive input from the user and can deliver the user input to the data module 308. The data module 308 can provide data characterizing the injection plan to the steam generator and to the distributor to be implemented, as described above.

The optimized injection plan allows SAGD systems to, reduce steam demands, maximize production, minimize costs associated with steam generation, increase production of oil-based material, preferentially allocate steam to well pairs that produce more oil-based material than other well pairs, improve control of sub-cooling, enhance diluent management, provide up/down dip notifications to a user (e.g., by delivering data to a user device 316), and facilitate monitoring and surveillance of extraction of the oil-based material. The subject matter described herein enables redesign of the injection plan for individual wells, well pads, and/or entire oil fields. By optimizing resource (e.g., steam) allocation, an increased return on investment can be achieved. Uncertainty regarding optimum steam allocation and injection can be control and quantified to provide acceptable confidence intervals.

Redesign of the injection plan can be performed automatically, in real time, to avoid up-dip and conformance. Conformance can be a uniformity in a production zone along a horizontal length of a well. In some cases, the analysis module can determine multiple injection plans based on connectivity vectors, multiple optimization objectives, weighted optimization objectives, the estimated rate of future fluid production $q_{t,j}^{k,F}$, and/or the estimated rate of future oil production $q_{o,j}^{k,F}$.

In some cases, the data module 308 can provide data to the analysis module 314 characterizing current sub-cool values. For example, the data module can provide temperature measurements from sensors (e.g., sensors 113, 115) positioned along the lengths of horizontal portions of the wells. If the current sub-cool is insufficient, the analysis module 314 can adjust the injection plan to ensure that a desirable sub-cool is maintained. By redesigning the injection plan in real time, a "sub-cool" of each well be controlled.

Figure 6:
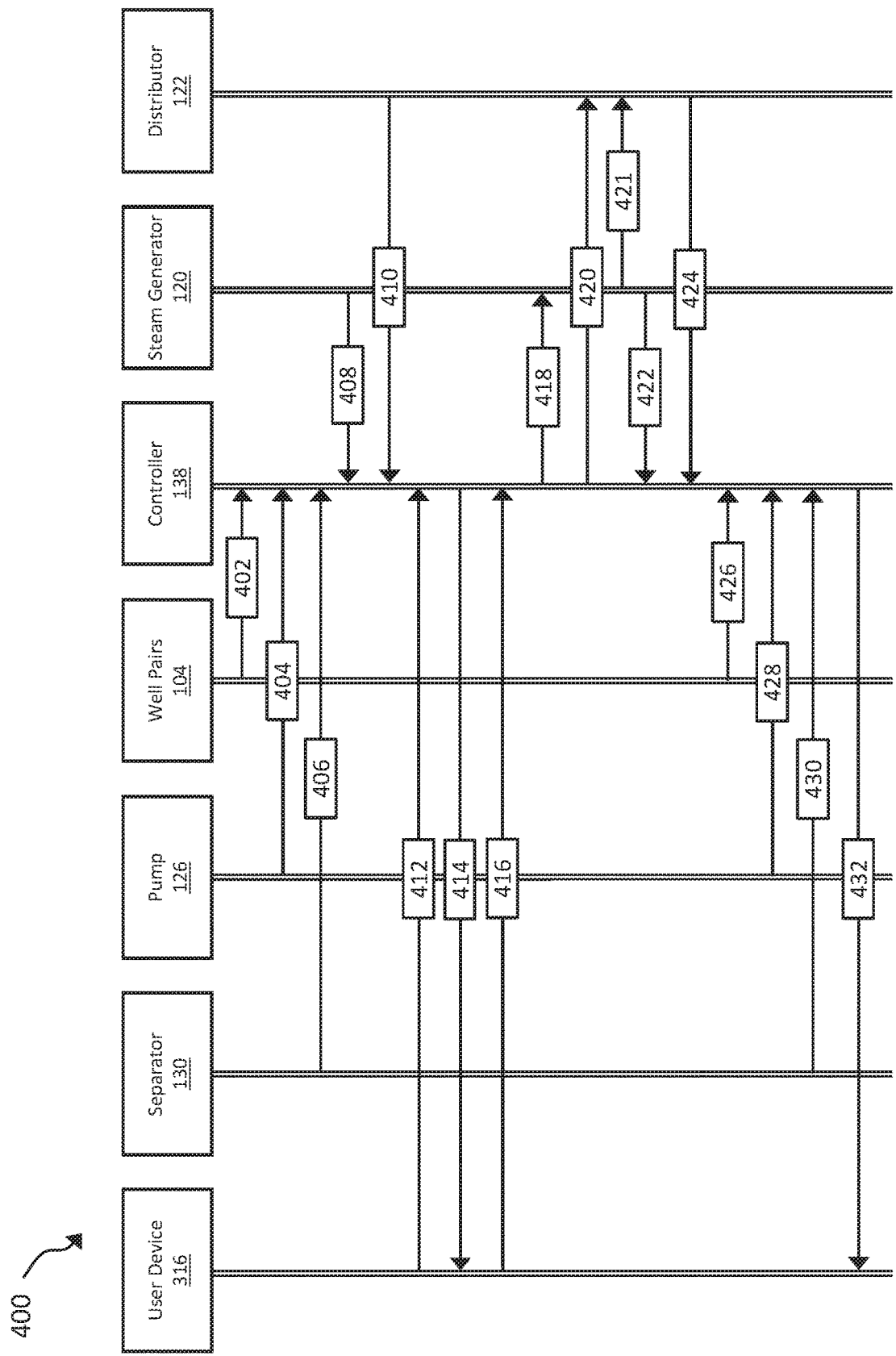
FIG. 6 is a data flow diagram that illustrates data flow between various components of the SAGD system shown in FIG. 1.

FIG. 6 shows a data flow diagram 400 that illustrates data flow between various components of the SAGD system 100. In the illustrated example, at 402, sensors 113, 115 of the well pairs 104 can provide data to the controller 138. The data can characterize measured temperatures of fluids exiting injection the injection wells 106 and entering the production wells 108. The data can be used to adjust properties of steam delivered to injection wells 106 to ensure that an appropriate amount of sub-cool is maintained, as described herein.

At 404, sensors corresponding to the pumps 126 can provide data to the controller 138. The data can characterize amounts and/or flow rates of fluid produced from each production well 108. In some embodiments, sensors corresponding to the aggregator 128 can provide data to the controller 138 characterizing total amounts, and/or flow rates, of the fluid received from the pumps 126. As another example, sensors corresponding to the separator 130 can provide data to the controller 138 characterizing amounts, and/or flow rates, of the mixture provided by the aggregator 128.

At 406, sensors corresponding to the separator 130 can provide data to the controller 138 characterizing amounts of oil-based material produced as well as amounts and/or flow rates of water produced. In some embodiments, sensors of the production tank 132 and the water treatment system 134 can deliver data to the controller 138 characterizing amounts and/or flow rates of oil-based material and water produced, respectively.

At 408, sensors of the steam generator 120 can provide data to the controller 138 characterizing temperature, pressure, quality, amounts, and/or flow rates, of steam delivered to the distributor 122.

At 410, sensors of the distributor 122 can provide data to the controller 138 characterizing temperature, pressure, quality, amounts, and/or flow rates, of steam delivered to each of the injection wells 106.

In some embodiments, at 412, a user can provide data to the controller 138 characterizing an emulsion viscosity of the mixture of oil-based material and water, and an optimization objective via a user device 316. The controller 138 can use the data received at steps 402, 404, 406, 408, 410, 412 to estimate a rate of future oil production corresponding to production wells 108, and optimize resource (e.g., steam) allocation to injection wells 106, by utilizing a capacitance resistance model (CRM) combined with a Koval fractional flow model, as described herein. For example, the controller 138 can determine connectivity $f_{ij}$, fluid flow potential $\tau_j$, Koval factor $K_{val,j}$, and production drainage volume $t_{D,j}$, using a history matching technique. The controller 138 can also determine an estimated rate of future fluid production $q_{t,j}^{k,F}$, estimated rate of future oil production $q_{o,j}^{k,F}$ and determine an injection plan based on an optimization objective.

The injection plan can include data characterizing amounts of steam to deliver to the injection wells, distributions of steam among the injection wells, time periods for steam to be injected, vapor qualities of the steam, and rates of steam injection into the injection wells. The optimized injection plan allows SAGD systems to maximize production, and minimize costs associated with steam generation. In some cases, steam can be preferentially allocated to well pairs that produce more oil-based material than other well pairs.

At 414, the controller 138 can provide data to the user device 316 characterizing the injection plan to allow the user to execute the injection plan. The user can review the injection plan and optionally modify the injection plan. The user can then enter data on the user device 316 to provide data to the controller 138 characterizing a desired injection plan, and a command to execute the injection plan.

At 416, the controller 138 can receive the data, and execute the injection plan accordingly.

To execute the injection plan, at 418, the controller 138 can provide data to the steam generator 120. At 420, the controller 138 can provide data to the distributor 122 characterizing the injection plan. Using the received injection plan, the steam generator 120 can generate steam and, at 421, provide the steam to the distributor based on the injection plan. The distributor 122 can distribute steam among the injection wells 106 based the distribution specified in the injection plan.

At 422, sensors of the steam generator 120 and the distributor 122 can provide performance data 422, 424 to the controller 138. The performance data can characterize a temperature, pressure, quality, amounts, and/or flow rates, of steam delivered to the distributor 122.

At 424, sensors of the distributor 122 can provide performance data to the controller 138. The performance data can characterize a temperature, pressure, quality, amounts, and/or flow rates, of steam delivered each of the injection wells 106. The controller 138 can use the received performance data to verify that the injection plan is being executed properly. Additionally, the controller 138 can use the data received from the steam generator 120 and the distributor 122 to update values of connectivity $f_{ij}$, fluid flow potential $\tau_j$, Koval factor $K_{val,j}$, and production drainage volume $t_{D,j}$, drainage pore volume $V_{p,j}$, and/or reservoir heterogeneity $H_K$, using a history matching technique, as described herein. The controller 138 can use the updated values to determine an updated estimated rate of future fluid production $q_{t,j}^{k,F}$, estimated rate of future oil production $q_{o,j}^{k,F}$ and determine a new injection plan based on an optimization objective.

At 426, sensor 113, 115 of the well pairs 104 can provide data to the controller 138 characterizing measured temperatures of fluids exiting injection the injection wells 106 and entering the production wells 108.

At 428 sensors corresponding to the pumps 126 can provide data to the controller 138 characterizing amounts and/or flow rates of fluid produced from each production well 108. In some embodiments, sensors corresponding to the aggregator 128 can provide data to the controller 138 characterizing total amounts, and/or flow rates, of the fluid received from the pumps 126. As another example, sensors corresponding to the separator 130 can provide data to the controller 138 characterizing amounts, and/or flow rates, of the mixture provided by the aggregator 128.

At 430, sensors corresponding to the separator 130 can provide data to the controller 138 characterizing amounts of oil-based material produced as well as amounts of water produced. In some embodiments, sensors of the production tank 132 and the water treatment system 134 can deliver data to the controller 138 characterizing amounts and/or flow rates of oil-based material and water produced, respectively. The data provided at 426, 428, 430, which can be referred to as production data, can be used to monitor production performance of the SAGD system 100.

In the illustrated embodiment, at 432, the controller 138 can provide data to the user device 316 characterizing the performance data provided at 422, 426 and the production data provided at 426, 428, 430. The performance data and the production data can be used to monitor operation of the SAGD system.

The subject matter described herein can enable management of diluent (e.g., C5, C6) mixtures to best fit daily production of the oil-based resource. Diluent can be fluids comprised of lighter hydrocarbons, which can be used to facilitate transportation of the oil via pipelines. An amount of diluent used to facilitate transportation of the oil can depend on the amount of oil produced. Therefore, knowledge of future oil production can allow plant operators to determine appropriate amounts of diluent that will be required in the future. Management of diluent can reduce expenses associated with maintaining an on-site inventory of diluent.

In some cases, the analysis module 314 can adjust the injection plan based on information related to choke valve settings for individual wells, a well pad, and/or multiple well pads. For example, the data module 308 can provide data to the analysis module 314 characterizing choke valve setting. The analysis module 314 can adjust the injection plan based on the choke valve settings. Choke valves can be used to control flow of steam into the injection wells. For example, choke valves can be used to control pressure and/or flow rate of steam into injection wells.

During operation, the data module 308 can record data characterizing steam injection rates, total fluid production from individual wells, total oil production, and temperatures measured from downhole sensors (e.g., sensors 113, 115). The data module 308 can also receive data characterizing injection plans, including, e.g., steam allocation, and injection rates, connectivity vectors, and production drainage volumes from the analysis module 314. The data module 308 can provide data characterizing the injection plans to a steam generator (e.g., steam generator 120) and a distributor (e.g., distributor 122) to update operation of the SAGD system. The data module 308 can deliver the data to a user device 316 in real time to provide information regarding operation of the SAGD system to operators. For example, the data module 308 can deliver up/down dip notifications to a user device (e.g., via the user device 316).

In some cases, the model parameters $f_{ij}$, $\tau_j$, $K_{val,j}$, $t_{D,j}$, $V_{p,j}$, $H_K$ can change over time as oil-based material is extracted from the reservoir. Periodically, the injection plan data (e.g., the steam injection rates) can be delivered to the CRM module 302, and data characterizing fluid production and oil production can be delivered to the analysis module 306. History matching can then be performed to update the model parameters $f_{ij}$, $\tau_j$, $K_{val,j}$, $t_{D,j}$, $V_{p,j}$, $H_K$ as described above.

The subject matter described herein treats reservoirs (e.g., reservoir 110) as a "black box" to preserver a material balance in porous media for mimicking injection and production performance, in contrast to traditional use of dynamic reservoir simulation based 3D geocellular models. 3D geocellular models can require expensive and time consuming workflow, taking weeks, or sometimes months, to converge for history matching with actual production data.

Traditional approaches to design of thermal recovery systems (e.g., SAGD systems) can be based on operator's experience, intuition, benchmarking, and observation of similar systems, rather than field-specific historical response and evaluation strategies. Typical 3D dynamic simulations can be time consuming to perform and can result in a time lapse response for the thermal recovery operations. Therefore, the results of the simulations can be outdated by the time that they are determined. By applying an emulsion viscosity within the Koval fractional flow model, the current subject matter can facilitate reduced analysis times as compared to 3D dynamic simulations and optimization strategies, thereby improving performance of the thermal recovery system (e.g., the SAGD system).

Although some example implementations are described above, other implementations are possible. For example, other analytical techniques such as, e.g., empirical and/or machine learning techniques, can be used to create injection plans based on optimization objectives.

Exemplary technical effects of the subject matter described herein include the ability to forecast production of an oil-based material from one or more production well of a SAGD system, optimize resource allocation to individual injection wells based on an optimization objective, e.g., SOR, and improve performance of thermal recovery systems (e.g., SAGD systems). The subject matter described herein, including applying an emulsion viscosity within the Koval fractional flow model, can enable a redesign of injection plans for individual wells, well pads, and/or an entire oil field. Using the current subject matter, redesign of the injection plan for individual wells can be done automatically in real time to avoid up-dip and conformance. In some implementations of the current subject matter, injection plans can be implemented at steam generators (e.g., steam generator 120) and/or distributors (e.g., distributor 122) to optimize the SAGD system based on the optimization objective. The subject matter described herein can be used for well pad design and well spacing. Other exemplary technical effects of the subject matter described herein include the ability to improve efficiency of thermal recovery systems (e.g., SAGD systems), enable management of diluent to best fit daily production of oil-based material, improved control of sub-cool, and decrease analysis time required to optimize resource allocation based on an optimization objective.

One skilled in the art will appreciate further features and advantages of the subject matter described herein based on the above-described embodiments. Accordingly, the present application is not to be limited specifically by what has been particularly shown and described. All publications and references cited herein are expressly incorporated herein by reference in their entirety.

Other embodiments are within the scope and spirit of the disclosed subject matter. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Further, in the present disclosure, like-named components of the embodiments generally have similar features, and thus within a particular embodiment each feature of each like-named component is not necessarily fully elaborated upon. Additionally, to the extent that linear or circular dimensions are used in the description of the disclosed systems, devices, and methods, such dimensions are not intended to limit the types of shapes that can be used in conjunction with such systems, devices, and methods. A person skilled in the art will recognize that an equivalent to such linear and circular dimensions can easily be determined for any geometric shape.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

What is claimed is:

1. A system comprising at least one data processor and memory coupled to the processor, the memory storing executable instructions, which, when executed by the at least one data processor, implement operations comprising:
    receiving operational data characterizing operating parameters of a steam assisted gravity drainage (SAGD) system, the SAGD system having at least one injection well configured to deliver steam to an oil sands reservoir, and at least one production well configured receive a fluid, the fluid being a mixture of oil and water from the oil sands reservoir, the operating parameters including an emulsion viscosity of bitumen and water;

receiving data characterizing a Koval factor corresponding to the at least one production well, a production drainage volume, an estimated future injection contribution, and an estimated rate of future fluid production, wherein the production drainage volume characterizes a volume of water received in a pore drainage volume of the at least one production well, and the estimated future injection contribution characterizes an estimated amount of water that will be delivered to the at least one production well;

determining an estimated rate of future oil production from the at least one production well by applying the production drainage volume, the estimated future injection contribution, the estimated rate of future fluid production, and the Koval factor as a function of the operating emulsion viscosity of bitumen and water that vary as a result of saturation and a change in pressure within the oil sands reservoir as the reservoir is depleted, within a first Koval fractional flow model; and providing the estimated rate of future oil production.

2. The system of claim 1, the operations further comprising receiving injection plan data characterizing a hypothetical rate of steam injection into the at least one injection well;

receiving data characterizing a fluid flow potential and at least one connectivity vector, wherein the fluid flow potential characterizes a reservoir response to steam injection, and the at least one connectivity vector characterizes a fraction of steam injected into the at least one injection well that contributes to production of the fluid;

determining an estimated rate of future fluid production from the at least one production well by applying the injection plan data, and data characterizing the at least one connectivity vector and the fluid flow potential, within a first capacitance resistance model; and determining the estimated future injection contribution using data characterizing the hypothetical rate of steam injection and the at least one connectivity vector.

3. The system of claim 2, the operations further comprising:

receiving data characterizing at least one optimization objective;

determining an injection plan that includes instructions for generating steam and instructions for delivering the steam, based on data characterizing the at least one optimization objective, the estimated rate of future oil production, and the estimated rate of future fluid production, wherein the instructions for generating the steam include data characterizing an amount of steam to generate, a temperature of the steam, time periods in which steam is to be generated, steam generation rates, and a vapor quality of the steam, and wherein the instructions for delivering the steam include data characterizing an updated hypothetical rate of steam injection, time periods for steam to be injected, and a distribution of steam to be delivered to the at least one injection well;

delivering data characterizing the instructions for generating steam to a steam generator of the SAGD system;

generating steam based on the instructions for generating steam;

delivering data characterizing the instructions for delivering the steam to a distributor of the SAGD system, the distributor being configured to deliver steam to the at least one injection well;

delivering the steam to the distributor; and delivering the steam to the at least one injection well based on the instructions for delivering the steam.

4. The system of claim 3, wherein the optimization objective is a steam-to-oil ratio (SOR) characterizing a ratio of a volume of steam injected into the at least one injection well to a volume of oil produced.

5. The system of claim 2, the operations further comprising:

receiving data characterizing an injection contribution, a calculated rate of fluid production, and the emulsion viscosity, wherein the injection contribution characterizes an amount of water delivered to the at least one production well;

determining the Koval factor and the production drainage volume by applying the emulsion viscosity, an injection contribution, and a calculated rate of fluid production, within a second Koval fractional flow model; and providing the Koval factor and the production drainage volume.

6. The system of claim 5, wherein determining the Koval factor and the production drainage volume includes:

receiving data characterizing an observed rate of oil production;

receiving data characterizing an initial Koval factor and an initial pore drainage volume of the reservoir;

determining a calculated rate of oil production by applying data characterizing the initial Koval factor and the initial pore drainage volume within the second Koval fractional flow model;

comparing the calculated rate of oil production with the observed rate of oil production; and adjusting the initial Koval factor and the pore drainage volume based on difference between the calculated rate of oil production and the observed rate of oil production.

7. The system of claim 5, the operations further comprising receiving data characterizing a rate of steam injection into the at least one injection well, an initial connectivity vector characterizing an initial estimated fraction of steam injected into the at least one injection well that contributes to production of the fluid, and an initial time constant characterizing an initial estimated rate of fluid flow from the at least one injection well to the at least one production well; and determining the calculated rate of fluid production, the fluid flow potential, the at least one connectivity vector, and the injection contribution, by applying the data characterizing the initial connectivity vector, the initial time constant, and the rate of steam injection, within a second capacitance resistance model.

8. The system of claim 7, wherein determining the fluid flow potential and the at least one connectivity vector includes:

receiving data characterizing an observed rate of fluid production from the at least one production well;

comparing the calculated rate of fluid production with the observed rate of fluid production; and adjusting the initial connectivity vector and the initial time constant based on differences between the calculated rate of fluid production and the observed rate of fluid production.

9. A method, comprising:

receiving operational data characterizing operating parameters of a steam assisted gravity drainage (SAGD) system, the SAGD system having at least one injection well configured to deliver steam to an oil sands reservoir, and at least one production well configured receive a fluid, the fluid being a mixture of oil and water from the oil sands reservoir, the operating parameters including an emulsion viscosity of bitumen and water;

receiving data characterizing a Koval factor corresponding to the at least one production well, a production drainage volume, an estimated future injection contribution and an estimated rate of future fluid production, wherein the production drainage volume characterizes a volume of water received in a pore drainage volume of the at least one production well, and the estimated future injection contribution characterizes an estimated amount of water that will be delivered to the at least one production well;

determining an estimated rate of future oil production from the at least one production well by applying the production drainage volume, the estimated future injection contribution, the estimated rate of future fluid production, and the Koval factor as a function of the operating emulsion viscosity of bitumen and water that vary as a result of saturation and a change in pressure within the oil sands reservoir as the reservoir is depleted, within a first Koval fractional flow model; and providing the estimated rate of future oil production.

10. The method of claim 9, further comprising
receiving injection plan data characterizing a hypothetical rate of steam injection into the at least one injection well;
receiving data characterizing a fluid flow potential and at least one connectivity vector, wherein the fluid flow potential characterizes a reservoir response to steam injection, and the at least one connectivity vector characterizes a fraction of steam injected into the at least one injection well that contributes to production of the fluid;
determining an estimated rate of future fluid production from the at least one production well by applying the injection plan data, and data characterizing the at least one connectivity vector and the fluid flow potential, within a first capacitance resistance model; and
determining the estimated future injection contribution using data characterizing the hypothetical rate of steam injection and the at least one connectivity vector.

11. The method of claim 10, further comprising:
receiving data characterizing at least one optimization objective;
determining an injection plan that includes instructions for generating steam and instructions for delivering the steam, based on data characterizing the at least one optimization objective, the estimated rate of future oil production, and the estimated rate of future fluid production, wherein the instructions for generating the steam include data characterizing an amount of steam to generate, a temperature of the steam, time periods in which steam is to be generated, steam generation rates, and a vapor quality of the steam, and wherein the instructions for delivering the steam include data characterizing an updated hypothetical rate of steam injection, time periods for steam to be injected, and a distribution of steam to be delivered to the at least one injection well;
delivering data characterizing the instructions for generating steam to a steam generator of the SAGD system;
generating steam based on the instructions for generating steam;
delivering data characterizing the instructions for delivering the steam to a distributor of the SAGD system, the distributor being configured to deliver steam to the at least one injection well;
delivering the steam to the distributor; and
delivering the steam to the at least one injection well based on the instructions for delivering the steam.

12. The method of claim 11, wherein the optimization objective is a steam-to-oil ratio (SOR) characterizing a ratio of a volume of steam injected into the at least one injection well to a volume of oil produced.

13. The method of claim 10, further comprising:
receiving data characterizing an injection contribution, a calculated rate of fluid production, and the emulsion viscosity, wherein the injection contribution characterizes an amount of water delivered to the at least one production well;
determining the Koval factor and the production drainage volume by applying the emulsion viscosity, an injection contribution, and a calculated rate of fluid production, within a second Koval fractional flow model; and
providing the Koval factor and the production drainage volume.

14. The method of claim 13, wherein determining the Koval factor and the production drainage volume includes:
receiving data characterizing an observed rate of oil production;
receiving data characterizing an initial Koval factor and an initial pore drainage volume of the reservoir;
determining a calculated rate of oil production by applying data characterizing the initial Koval factor and the initial pore drainage volume within the second Koval fractional flow model;
comparing the calculated rate of oil production with the observed rate of oil production; and
adjusting the initial Koval factor and the pore drainage volume based on difference between the calculated rate of oil production and the observed rate of oil production.

15. The method of claim 13, further comprising:
receiving data characterizing a rate of steam injection into the at least one injection well, an initial connectivity vector characterizing an initial estimated fraction of steam injected into the at least one injection well that contributes to production of the fluid, and an initial time constant characterizing an initial estimated rate of fluid flow from the at least one injection well to the at least one production well; and
determining the calculated rate of fluid production, the fluid flow potential, the at least one connectivity vector, and the injection contribution, by applying the data characterizing the initial connectivity vector, the initial time constant, and the rate of steam injection, within a second capacitance resistance model.

16. The method of claim 15, wherein determining the fluid flow potential and the at least one connectivity vector includes:
receiving data characterizing an observed rate of fluid production from the at least one production well;
comparing the calculated rate of fluid production with the observed rate of fluid production; and
adjusting the initial connectivity vector and the initial time constant based on differences between the calculated rate of fluid production and the observed rate of fluid production.

17. The method of claim 9, wherein at least one of the receiving, determining, and providing is performed by at least one data processor forming part of at least one computing system.

18. A non-transitory computer program product comprising computer readable instructions, which, when executed by at least one data processor forming part of at least one computing system, implement operations comprising:
receiving operational data characterizing operating parameters of a steam assisted gravity drainage (SAGD) system, the SAGD system having at least one injection well configured to deliver steam to an oil sands reservoir, and at least one production well configured receive a fluid, the fluid being a mixture of oil and water from the oil sands reservoir, the operating parameters including an emulsion viscosity of bitumen and water;
receiving data characterizing a Koval factor corresponding to the at least one production well, a production drainage volume, an estimated future injection contribution, and an estimated rate of future fluid production, wherein
the production drainage volume characterizes a volume of water received in a pore drainage volume of the at least one production well, and
the estimated future injection contribution characterizes an estimated amount of water that will be delivered to the at least one production well;
determining an estimated rate of future oil production from the at least one production well by applying the production drainage volume, the estimated future injection contribution, the estimated rate of future fluid production, and the Koval factor as a function of the operating emulsion viscosity of bitumen and water that vary as a result of saturation and a change in pressure within the oil sands reservoir as the reservoir is depleted, within a first Koval fractional flow model; and
providing the estimated rate of future oil production.

19. The non-transitory computer program product of claim 18, the operations further comprising
receiving injection plan data characterizing a hypothetical rate of steam injection into the at least one injection well;
receiving data characterizing a fluid flow potential and at least one connectivity vector, wherein
the fluid flow potential characterizes a reservoir response to steam injection, and
the at least one connectivity vector characterizes a fraction of steam injected into the at least one injection well that contributes to production of the fluid;
determining an estimated rate of future fluid production from the at least one production well by applying the injection plan data, and data characterizing the at least one connectivity vector and the fluid flow potential, within a first capacitance resistance model; and
determining the estimated future injection contribution using data characterizing the hypothetical rate of steam injection and the at least one connectivity vector.

20. The non-transitory computer program product of claim 19, the operations further comprising:
receiving data characterizing at least one optimization objective;
determining an injection plan that includes instructions for generating steam and instructions for delivering the steam, based on data characterizing the at least one optimization objective, the estimated rate of future oil production, and the estimated rate of future fluid production, wherein the instructions for generating the steam include data characterizing an amount of steam to generate, a temperature of the steam, time periods in which steam is to be generated, steam generation rates, and a vapor quality of the steam, and wherein the instructions for delivering the steam include data characterizing an updated hypothetical rate of steam injection, time periods for steam to be injected, and a distribution of steam to be delivered to the at least one injection well;
delivering data characterizing the instructions for generating steam to a steam generator of the SAGD system;
generating steam based on the instructions for generating steam;
delivering data characterizing the instructions for delivering the steam to a distributor of the SAGD system, the distributor being configured to deliver steam to the at least one injection well;
delivering the steam to the distributor; and
delivering the steam to the at least one injection well based on the instructions for delivering the steam.

21. The non-transitory computer program product of claim 20, wherein the optimization objective is a steam-to-oil ratio (SOR) characterizing a ratio of a volume of steam injected into the at least one injection well to a volume of oil produced.

22. The non-transitory computer program product of 19, the operations further comprising:
receiving data characterizing an injection contribution, a calculated rate of fluid production, and the emulsion viscosity, wherein
the injection contribution characterizes an amount of water delivered to the at least one production well;
determining the Koval factor and the production drainage volume by applying the emulsion viscosity, an injection contribution, and a calculated rate of fluid production, within a second Koval fractional flow model; and
providing the Koval factor and the production drainage volume.

23. The non-transitory computer program product of claim 22, wherein determining the Koval factor and the production drainage volume includes:
receiving data characterizing an observed rate of oil production;
receiving data characterizing an initial Koval factor and an initial pore drainage volume of the reservoir;
determining a calculated rate of oil production by applying data characterizing the initial Koval factor and the initial pore drainage volume within the second Koval fractional flow model;
comparing the calculated rate of oil production with the observed rate of oil production; and
adjusting the initial Koval factor and the pore drainage volume based on difference between the calculated rate of oil production and the observed rate of oil production.

24. The non-transitory computer program product of claim 22, the operations further comprising
receiving data characterizing a rate of steam injection into the at least one injection well, an initial connectivity vector characterizing an initial estimated fraction of steam injected into the at least one injection well that contributes to production of the fluid, and an initial time constant characterizing an initial estimated rate of fluid flow from the at least one injection well to the at least one production well; and determining the calculated rate of fluid production, the fluid flow potential, the at least one connectivity vector, and the injection contribution, by applying the data characterizing the initial connectivity vector, the initial time constant, and the rate of steam injection, within a second capacitance resistance model.

25. The non-transitory computer program product of claim 24, wherein determining the fluid flow potential and the at least one connectivity vector includes:

receiving data characterizing an observed rate of fluid production from the at least one production well;

comparing the calculated rate of fluid production with the observed rate of mixture production; and adjusting the initial connectivity vector and the initial time constant based on differences between the calculated rate of fluid production and the observed rate of fluid production.

\* \* \* \* \*